(12) United States Patent
Mignot et al.

(10) Patent No.: US 12,033,856 B2
(45) Date of Patent: Jul. 9, 2024

(54) LITHO-LITHO-ETCH (LLE) MULTI COLOR RESIST

(71) Applicant: International Business Machines Corporation, Armonk, NY (US)

(72) Inventors: Yann Mignot, Slingerlands, NY (US); Ekmini Anuja De Silva, Slingerlands, NY (US); Dario Goldfarb, Dobbs Ferry, NY (US)

(73) Assignee: International Business Machines Corporation, Armonk, NY (US)

( * ) Notice: Subject to any disclaimer, the term of this patent is extended or adjusted under 35 U.S.C. 154(b) by 463 days.

(21) Appl. No.: 17/489,018

(22) Filed: Sep. 29, 2021

(65) Prior Publication Data
US 2023/0096374 A1 Mar. 30, 2023

(51) Int. Cl.
*H01L 21/033* (2006.01)
*H01L 21/311* (2006.01)

(52) U.S. Cl.
CPC .... *H01L 21/0332* (2013.01); *H01L 21/31144* (2013.01)

(58) Field of Classification Search
None
See application file for complete search history.

(56) References Cited

U.S. PATENT DOCUMENTS

| | | | |
|---|---|---|---|
| 4,434,224 A | 2/1984 | Yoshikawa | |
| 7,214,603 B2 | 5/2007 | Dellaguardia | |
| 9,171,735 B2 | 10/2015 | Mehta | |
| 9,425,058 B2 | 8/2016 | Kim | |
| 10,991,583 B2 | 4/2021 | Hsiao | |
| 2009/0104566 A1 | 4/2009 | Burkhardt | |
| 2014/0312465 A1* | 10/2014 | Wang | H01L 21/76816 438/430 |

(Continued)

FOREIGN PATENT DOCUMENTS

| | | |
|---|---|---|
| CN | 109696797 A | 4/2019 |
| JP | 2002351049 A * | 12/2002 |

(Continued)

OTHER PUBLICATIONS

De SIimone-etal, "Metal-containing Materials as Turning Point of EUV Lithography," Journal of Photopolymer Science and Technology, vol. 28 Issue 4, Apr. 2015, pp. 507-514.

(Continued)

*Primary Examiner* — Michael Lebentritt
(74) *Attorney, Agent, or Firm* — Samuel Waldbaum; Otterstedt & Kammer PLLC (57) ABSTRACT

A method of forming a multi color resist structure includes providing a substrate including an underlayer material; forming a first organic planarizing layer on the substrate; forming a first anti reflecting layer on the first organic planarizing layer, forming and developing a first patterned resist on the first anti reflecting layer; forming a second organic planarizing layer on the first anti reflecting layer and on the first patterned resist; forming a second anti reflecting layer on the second organic planarizing layer and forming and developing the second patterned resist, wherein the first patterned resist is a non-chemically amplified resist (n-CAR) or metal resist and the second patterned resist is CAR organic resist.

17 Claims, 8 Drawing Sheets

(56) References Cited

U.S. PATENT DOCUMENTS

2021/0063873 A1    3/2021   Kobayashi

FOREIGN PATENT DOCUMENTS

| | | | | |
|---|---|---|---|---|
| JP | 2006178423 | A | * | 7/2006 |
| JP | 2008159874 | A | * | 7/2008 |
| JP | 2009002999 | A | * | 1/2009 |
| JP | 2009169267 | A | * | 7/2009 |
| JP | 2012044182 | A | * | 3/2012 |
| KR | 20210042205 | A | | 4/2021 |
| WO | 2009010904 | A2 | | 1/2009 |

OTHER PUBLICATIONS

Anonymous, "Lam Research Unveils Technology Breakthrough for EUV Lithography," Lam Research Newswire, Feb. 26, 2020, pp. 1-3.

Luo et al., "Review of recent advances in inorganic photoresists," RSC Adv., Feb. 2020, pp. 1-11.

El-Jaroudi, "Double Patterning" University of Texas, Nov. 2017, pp. 1-15.

\* cited by examiner

LITHO-LITHO-ETCH (LLE) MULTI COLOR RESIST

BACKGROUND

As integrated circuit technology improves and process size decreases, building metal interconnect structures that are used to wire transistors together becomes more challenging. Design rules for patterning metal lines are typically based on scaling a pitch dimension that assumes a regular pattern of equal line widths and spacings between the metal lines at each metal layer.

Litho-etch-litho-etch (LELE) is a form of double patterning in which two separate lithography ("litho") and etch steps are performed to define a single layer, thereby increasing the pattern density. LELE separates the layouts that cannot be printed with a single exposure, forming two lower-density masks. LELE uses two separate exposure processes to form two coarser patterns. These patterns are combined and superimposed, which enables a single finer image on the wafer.

LELE, and other forms of double patterning, typically have twice the number of steps as a single exposure process, include complicated etch steps, and require precise mask alignment.

BRIEF SUMMARY

According to embodiments of the present invention, a method of forming a multi color resist structure includes providing a substrate including an underlayer material; forming a first organic planarizing layer on the substrate; forming a first anti-reflective coating on the first organic planarization layer; forming a first patterned resist on the first anti-reflective coating; forming a second organic planarizing layer on the first anti-reflective coating and on the first patterned resist; forming a second anti-reflective coating on the second organic planarization layer; and forming the second patterned resist, wherein the first patterned resist is one of an non-chemically amplified resist (n-CAR) and a metal base resist, and the second patterned resist is a CAR organic resist.

According to embodiments of the present invention, a method of forming a multi color resist structure includes providing a substrate including an underlayer material; forming a first patterning stack on the underlayer material, wherein the first patterning stack is one of a first tri-layer patterning stack and a first quad-layer patterning stack, wherein forming the first patterning stack comprises forming a first patterned resist on the first patterning stack, wherein the first patterned resist is one of an non-chemically amplified resist (n-CAR) and a metal base resist; and forming a second patterning stack on the underlayer material, wherein the second patterning stack is one of a second tri-layer patterning stack and a second quad-layer patterning stack, wherein forming the second patterning stack comprises forming a second patterned resist, and the second patterned resist is a CAR organic resist.

According to embodiments of the present invention, a multi color resist structure includes an underlayer material; a first organic planarizing layer on the underlayer material; a first anti-reflective coating on the first organic planarization layer; a first patterned resist on the first anti-reflective coating, wherein the first patterned resist is one of an non-chemically amplified resist (n-CAR) and a metal base resist; a second organic planarizing layer disposed over the first patterned resist and on a portion the first anti-reflective coating exposed by the first patterned resist; a second anti-reflective coating on the second organic planarization layer; and a second patterned resist on the second anti-reflective coating, wherein the second patterned resist is a CAR organic resist.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in the form of a computer program product including a computer readable storage medium with computer usable program code for performing the method steps indicated. Furthermore, one or more embodiments of the invention or elements thereof can be implemented in the form of a system (or apparatus) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware mod-ule(s), (ii) software module(s) stored in a computer readable storage medium (or multiple such media) and implemented on a hardware processor, or (iii) a combination of (i) and (ii); any of (i)-(iii) implement the specific techniques set forth herein.

Techniques of the present invention can provide substantial beneficial technical effects. Some embodiments may not have these potential advantages and these potential advantages are not necessarily required of all embodiments. For example, one or more embodiments may provide for:

litho-litho-etch (LLE) patterning using a multi pattern stack;

a multi tri-layer or quad-layer patterning stack structures;

additional etch selectivity provided on multi color litho for pattern transfer; and additional block capability with superposition on an additional (e.g., second) resist color.

These and other features and advantages of the present invention will become apparent from the following detailed description of illustrative embodiments thereof, which is to be read in connection with the accompanying drawings.

BRIEF DESCRIPTION OF THE DRAWINGS

Preferred embodiments of the present invention will be described below in more detail, with reference to the accompanying drawings.

DETAILED DESCRIPTION

According to embodiments of the present invention, a litho-litho-etch (LLE) process using a multi color resist structure improves feature placement with high litho resolution. Compared to spacer-assisted double patterning (SADP), a LLE process according to an example embodiment of the present invention offers a cost and throughput advantage because it does not require the multiple deposition and etch steps needed to shrink regular dense patterns. Furthermore, with SADP, the flow will always result in lines that are connected in pairs at the line ends, and therefore a trim mask is needed. Similar advantages can be found for the LLE process when compared to a litho-etch-litho-etch (LELE) process flow, due to the reduced inter-tool wafer exchange sequences and etch steps. In one example embodiment, the LLE formation of resist via holes by intersection of cross resist lines patterned sequentially in X and Y directions can overcome the resolution limit of single exposure patterning, while providing complete feature definition at the resist level, i.e., the features of interest (e.g., holes) are fully formed in the imaging layer (resist), which facilitates early metrology verification and simplifies the optimization of the subsequent etch step.

In view of the foregoing, in one example implementation and according to some embodiments of the present invention, a LLE process has one fewer etch step and one fewer wet clean step as compared to a conventional LELE process.

As used herein, "color" refers to the use of a photo mask with patterns. According to some embodiments, dual- or multi-color refers to the use of different photo masks with different patterns, where the resists used in each step can be made of the same or different materials and can be sensitive to the same or different wavelengths of light. Typically, a multi-color process includes consecutive lithographic and etch steps that "memorize" a specific mask color onto a mask layer. Following multiple memorization processes, the defined pattern is transferred into a lower layer (i.e., a device layer), where the multi-color trenches are formed. As is well-known to the skilled artisan in the field of integrated circuit fabrication, photolithography uses light to transfer a geometric pattern from a photomask to a light-sensitive chemical photoresist, or resist, on a substrate.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Semiconductor device manufacturing includes various steps of device patterning processes. For example, the manufacturing of a semiconductor chip may start with, for example, a plurality of CAD (computer aided design) generated device patterns, which is then followed by effort to replicate these device patterns in a substrate. The replication process may involve the use of various exposing techniques and a variety of subtractive (etching) and/or additive (deposition) material processing procedures. For example, in a photolithographic process, a layer of photo-resist material may first be applied on top of a substrate, and then be exposed selectively according to a pre-determined device pattern or patterns. Portions of the photo-resist that are exposed to light or other ionizing radiation (e.g., ultraviolet, electron beams, X-rays, etc.) may experience some changes in their solubility to certain solutions. The photo-resist may then be developed in a developer solution, thereby removing the non-irradiated (in a negative resist) or irradiated (in a positive resist) portions of the resist layer, to create a photo-resist pattern or photo-mask. The photo-resist pattern or photo-mask may subsequently be copied or transferred to the substrate underneath the photo-resist pattern.

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, and reactive ion etching (RIE), which are all known techniques to remove select material(s) when forming a semiconductor structure. The Standard Clean 1 (SC1) contains a strong base, typically ammonium hydroxide, and hydrogen peroxide. The SC2 contains a strong acid such as hydrochloric acid and hydrogen peroxide. The techniques and application of etching is well understood by those skilled in the art and, as such, a more detailed description of such processes is not presented herein.

Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example: James D. Plummer et al., Silicon VLSI Technology: Fundamentals, Practice, and Modeling 1st Edition, Prentice Hall, 2001 and P. H. Holloway et al., Handbook of Compound Semiconductors: Growth, Processing, Characterization, and Devices, Cambridge University Press, 2008, which are both hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

Figure 1:
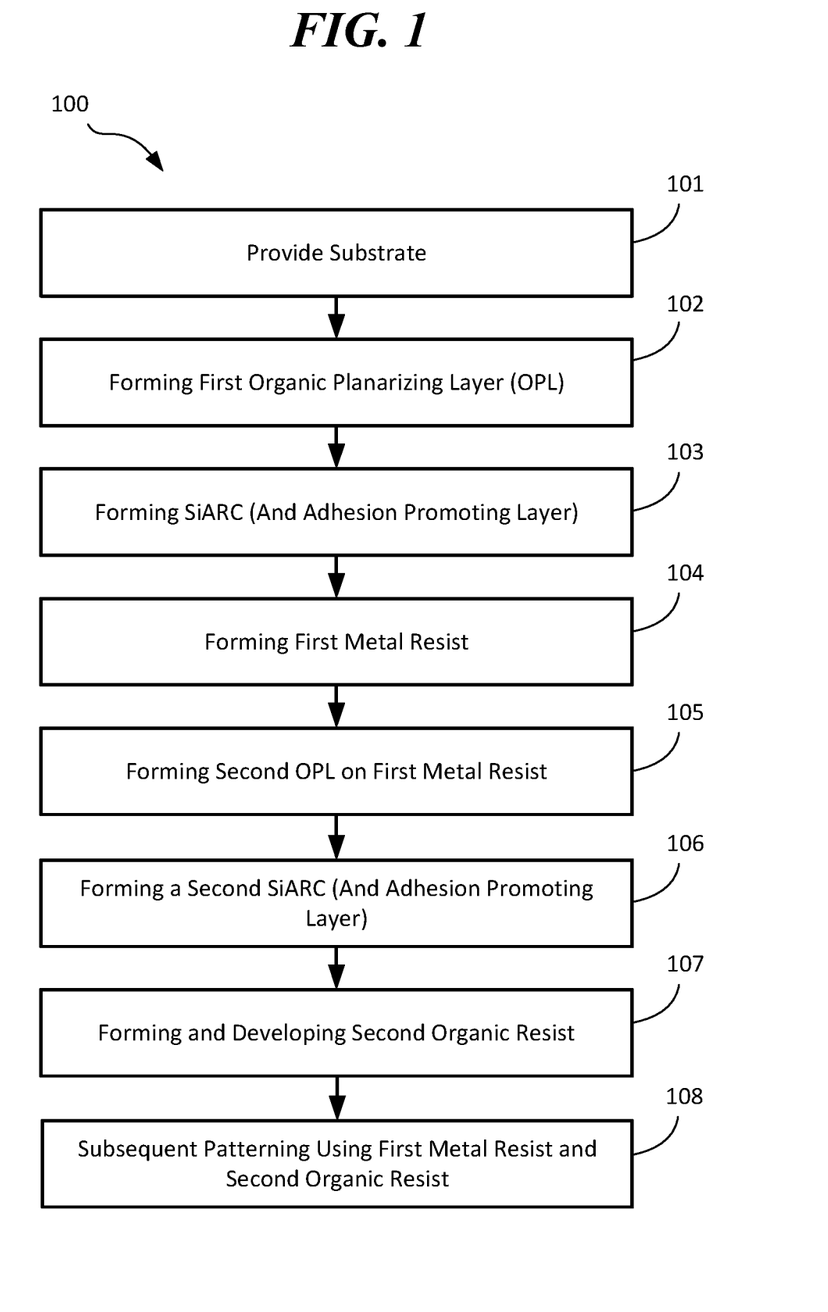
FIG. 1 is method of forming a multi color resist structure according to one or more embodiments of the present invention.

FIG. 1 shows a method of forming a multi color resist structure according to one or more embodiments of the present invention.

According to some embodiments of the present invention and referring to FIG. 1, a method 100 of forming a multi color resist structure includes providing a substrate at step 101 including an underlayer (UL) material such as an oxide or titanium nitride (TiN) hardmask (HMO). The method includes forming a first organic planarizing layer (OPL) at step 102 on the substrate. According to some embodiments, the method includes, at step 103, forming a first silicon anti-reflective coating (SiARC) or an equivalent having anti-reflective and masking properties.

According to some embodiments, a bottom anti-reflection coating (BARC) (see 1202, FIG. 13) can be formed, also at step 103, following the first SiARC, for example, for enhanced adhesion properties. The method includes forming and developing a first patterned resist at step 104 on the first SiARC, and forming a second OPL at step 105 on the first SiARC, and on the first patterned resist. According to some embodiments, the first patterned resist is a metal resist. According to some embodiments, the method includes forming a second SiARC at step 106, and if needed an adhesion promoting layer, such as a BARC (not shown here) can be formed between the second patterned resist and the second OPL. According to at least one embodiment, the method includes forming and developing a second patterned resist at step 107, which has different proprieties than the first patterned resist. According to some embodiments, the second patterned resist is an organic resist. According to some embodiments, subsequent patterning processes at step 108 use the first patterned resist and the second patterned resist to form a semiconductor device.

Figure 2:
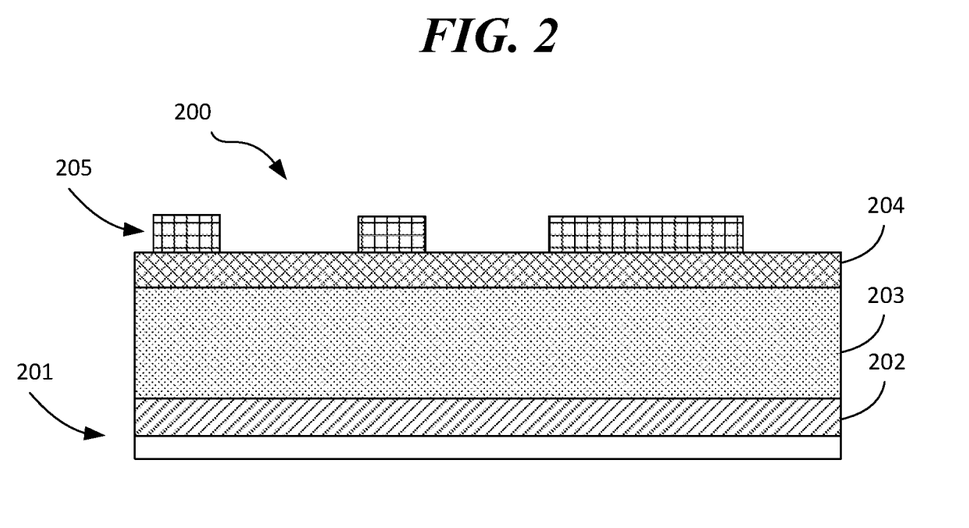
FIGS. 2-9 are cross-section views of a device at different steps in a manufacturing process according to one or more embodiments of the present invention.
Figure 3:
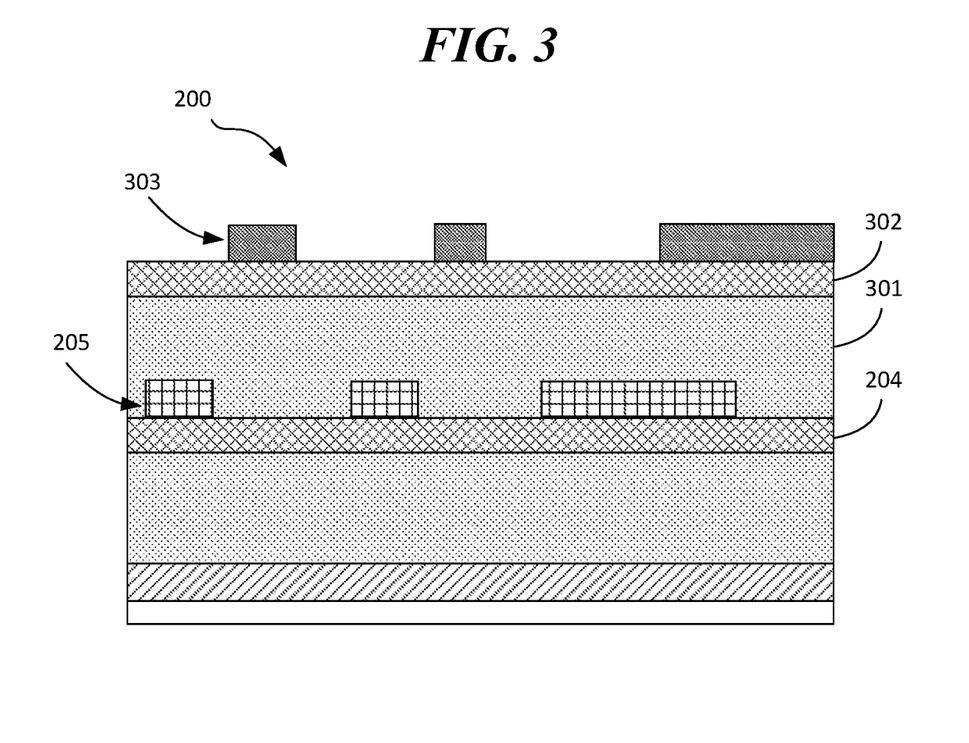

According to some embodiments of the present invention and referring to FIGS. 2-3, in a method of patterning trench features of a device 200, a substrate 201 is provided, where the substrate includes a UL material 202 such as an oxide or TiN HMO. According to some embodiments, the UL material 202 can be formed of TiN, tetraethyl orthosilicate (TEOS), silicon nitride (SiN), a poly material, etc. The device 200 includes a first OPL 203 disposed on a substrate. According to some embodiments, the device 200 includes a first SiARC 204, where the first SiARC has anti-reflecting and masking properties. The device 200 includes a first patterned resist 205 deposited on top of the first SiARC.

It should be understood that a SiARC is an example of an anti-reflective coating, and that other anti-reflective coatings can be used (for example, at steps 103 and 106 of FIG. 1), such as a low-temperature oxide (LTO) or the like.

Figure 13:
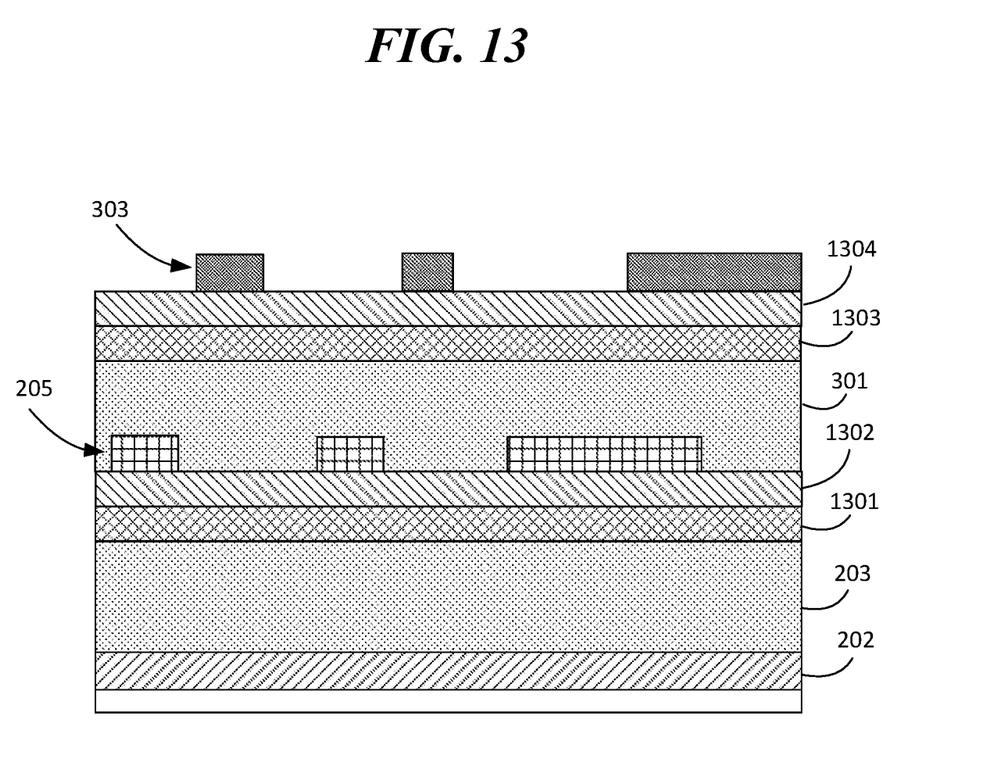
FIG. 13 is a cross-section via of a Quad-layer patterning Stack (QS) according to some embodiments of the present invention.

According to some embodiments, the first OPL 203, the first SiARC 204 (or first anti-reflective coating), and the first patterned resist 205 form a first Tri-layer patterning Stack (TS). In another embodiment and as shown in FIG. 13, a Quad-layer patterning Stack (QS) can be formed over the UL material 202 and includes the first OPL 203, a low temperature oxide 1301, an adhesion promoting layer 1302 (such as a BARC), and the first patterned resist 205. The masking stack (TS or QS), can be changed based on process needs.

According to some embodiments, the first patterned resist 205 is a metal based, non-chemically amplified resist (n-CAR), i.e., a first resist color. According to some embodiments of the present invention, one or more first exposure trenches can be memorized into a resist to form the first patterned resist 205.

According to some embodiments and referring to FIG. 3, the device 200 includes a second TS formed with a second OPL 301 disposed on the first SiARC 204, and on the first patterned resist 205, a second SiARC 302, and a second patterned resist 303.

According to example embodiments, the first SiARC 204 and the second SiARC 302 are memorization layers for respective mask colors.

According to an example embodiment, the first patterned resist 205 can be formed as a metal resist and the second patterned resist 303 can be formed as an organic resist. Examples of metal resists include tin oxide sol-gels butyl tin cages, heterometallic pivalates, olefine-metal hybrids, and zinc-oxoclusters. Example organic resists can be based on chemical amplification, chain-scission, or multi-trigger mechanisms, among others.

According to some embodiments, the metal resists, i.e., the first patterned resist 205, are resistant to the spin-coating or vacuum deposition of subsequent patterning layers. According to some embodiments, the organic resists, i.e., the second patterned resist 303, can be combined with silicon-containing layers in a tri-layer scheme (organic planarizing layer+SiARC+organic resist), which enables the transfer of the resist image into an underlying patterning stack with good dry etch selectivity, while simultaneously allowing for lateral feature shrinking.

According to some embodiments, the second OPL 301, the second SiARC 302, and the second patterned resist 303 is a second TS. According to at least one embodiment, the second patterned resist 303 is a second resist color chemically amplified resist (CAR) organic resist.

According to some embodiments of the present invention, a first exposure memorizing the first patterned resist 205 and a second exposure memorizing the second patterned resist 303 can be defined by 193 nm immersion or extreme ultraviolet (EUV) wavelengths, e.g., for example, at about 13.6 nm, which can achieve pitches between about 20-200 nm.

According to some embodiments, the second OPL 301, the second SiARC 302 (or second anti-reflective coating), and the second patterned resist 303 form a second TS. In another embodiment and as shown in FIG. 13, a QS can be formed including the second OPL 301, a second low temperature oxide 1303, a second adhesion promoting layer 1304 (such as a BARC), and the second patterned resist 303. It should be understood that the masking stacks, including TS and/or QS, can be changed based on process needs.

According to some embodiments, a first patterning stack including the first patterning resist is one of TS or QS, and a second pattering stack including the second patterning resist is one of TS or QS. That is, the first and second patterning stacks can be the same (e.g., TS-TS or QS-QS) or different. (e.g., TS-QS or QS-TS).

Figure 12:
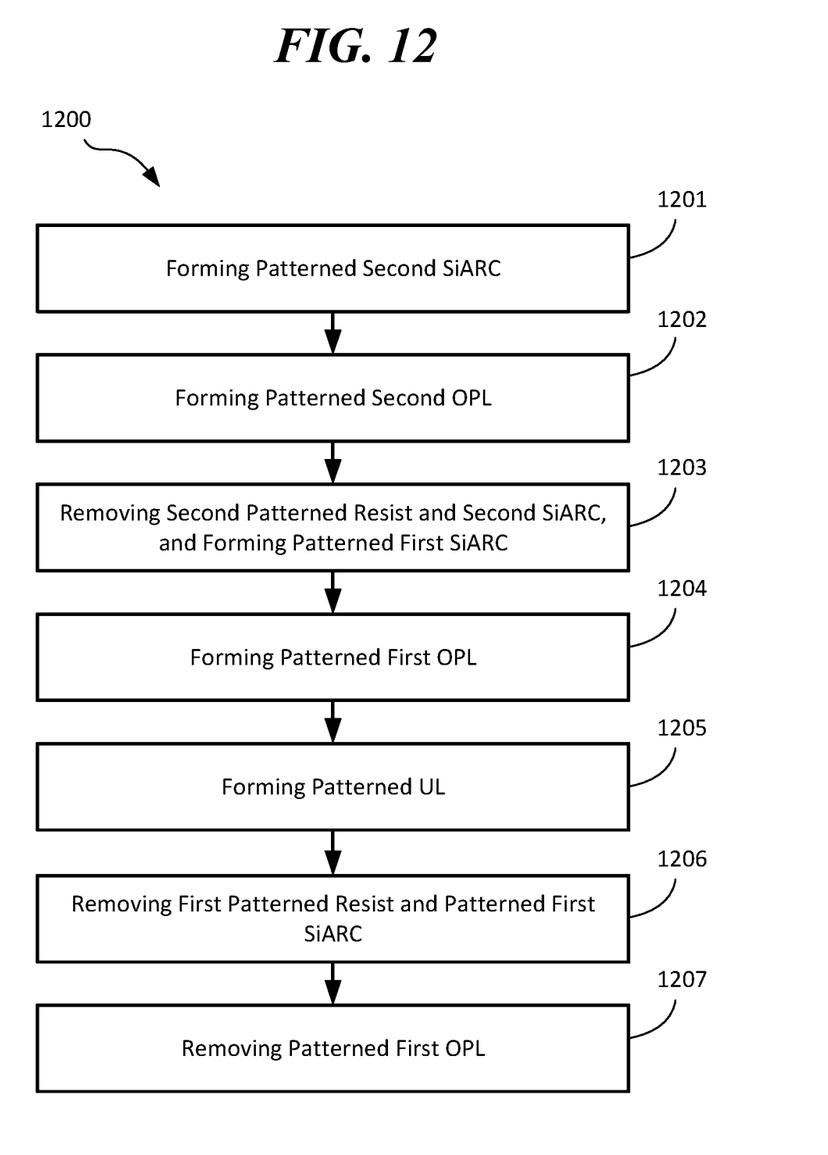
FIG. 12 is a method of patterning using a multi color structure according to one or more embodiments of the present invention.

FIGS. 4-9 illustrate a method of patterning using a multi color structure according to one or more embodiments of the present invention (see also FIG. 12).

Figure 4:
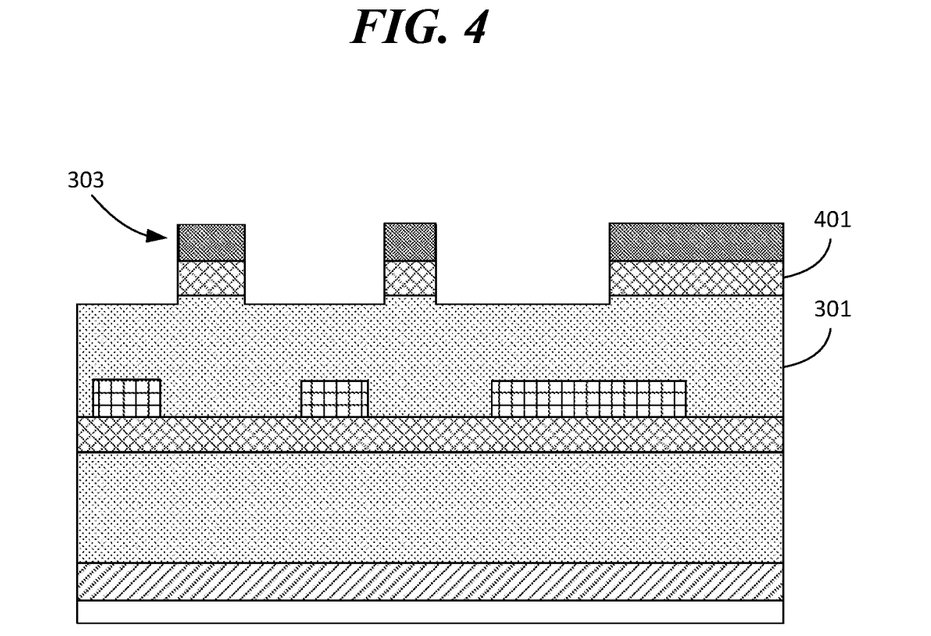

According to some embodiments and referring to FIG. 4, a SiARC etch, with tetrafluoromethane (CF4)/hydrogen bromide (HBr) like chemistry with selectivity to the second patterned resist 303 and the second OPL 301, removes a portion of the second SiARC, which is exposed by the second patterned resist 303, and forms a second patterned SiARC 401.

Figure 5:
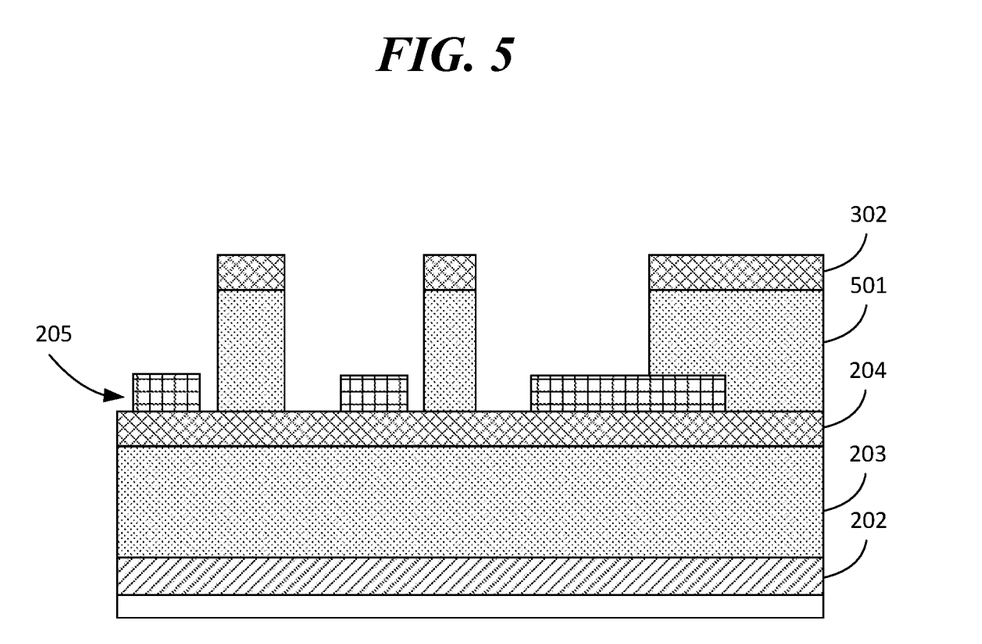

According to at least one embodiment and referring to FIG. 5, the second patterned resist 303 (see FIG. 4) is removed, e.g., by a burn off, and an OPL etch removes a portion of the second OPL 301, forming a second patterned OPL 501, using the second patterned SiARC 401 as a mask to control the material removal and profiles (see FIG. 4).

Typical etch chemistries to remove an OPL and resist include O2, CO2/CO2 and N2/H2. It's noted that the having an n-CAR metal resist provide enough selectivity during the sequence to etch the second OPL 301 and the burnoff of the second patterned SiARC 401.

Figure 6:
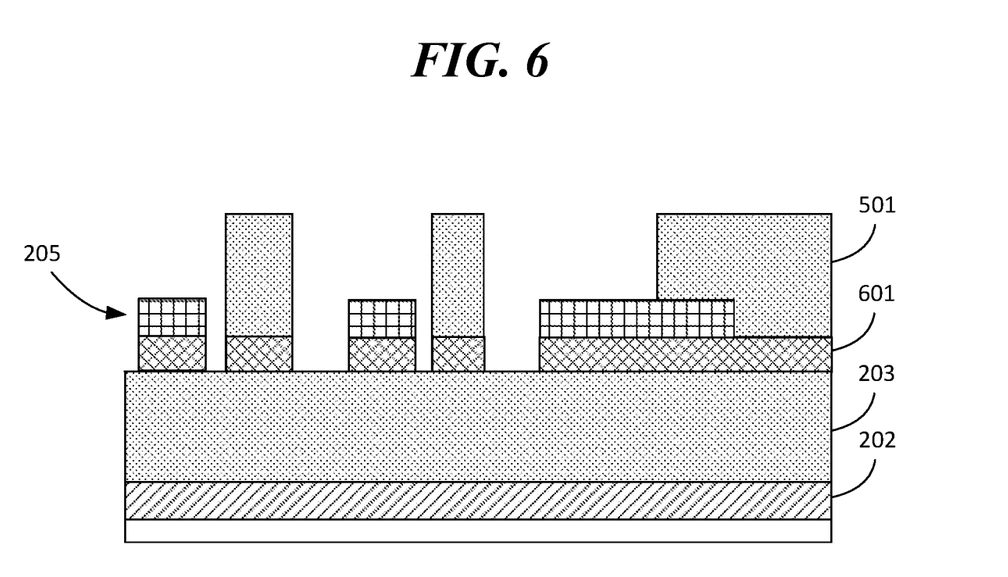

According to at least one embodiment and referring to FIG. 6, a SiARC open and burn off with an oxide etch chemistry (e.g., difluoromethane ($CH_2F_2$), perfluoroisobutylene ($C_4F_8$), etc.), with selectivity to the second patterned OPL 501 and the first patterned resist 205, removes the second SiARC (not shown) and a portion of the first SiARC 204, thereby forming a patterned first SiARC 601, exposing a portion of the first OPL 203.

Figure 7:
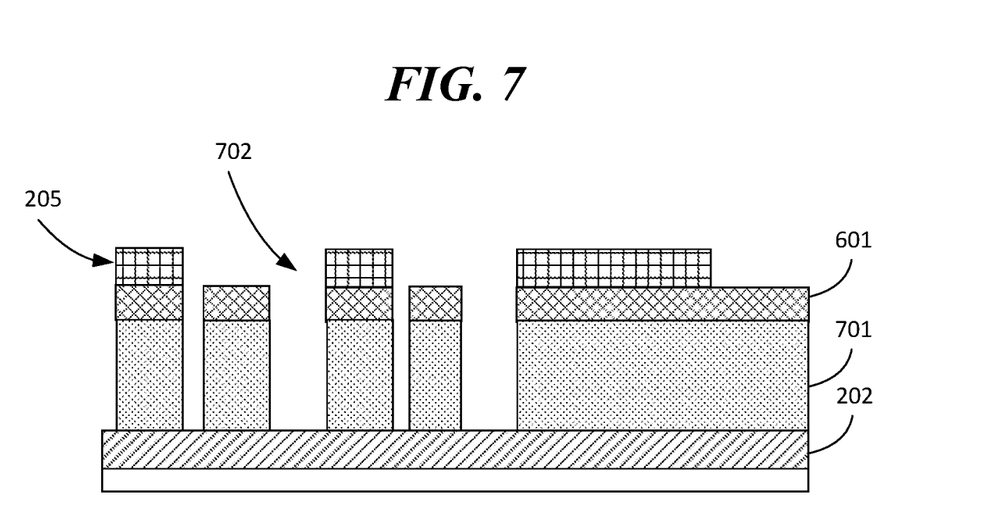

According to at least one embodiment and referring to FIG. 7, a bottom OPL etch and top OPL burn off removes a portion of the first OPL 203 (see FIG. 6) to form a patterned first OPL 701, exposing a portion of the UL material 202, and removes the second patterned OPL (not shown). As shown in FIG. 7, various trenches 702 can be formed having different geometry (e.g., widths) based on the multi color patterning.

Figure 8:
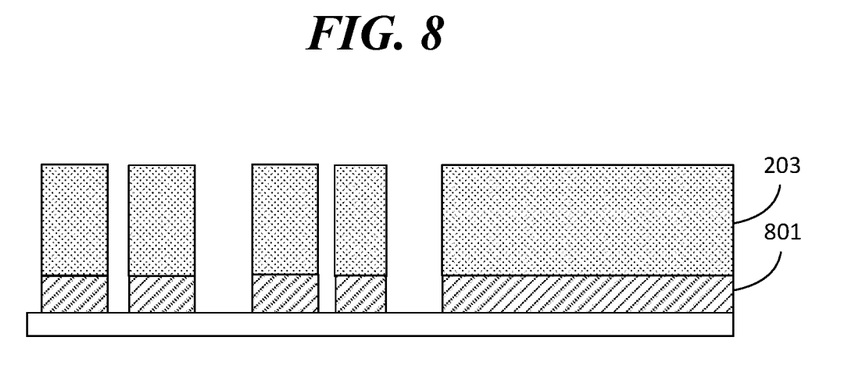

According to at least one embodiment and referring to FIG. 8, a bottom UL etch is performed to form a patterned UL 801. According to some embodiments of the present invention, features defined by the first patterned resist 205 and the second patterned resist 303 can be simultaneously transferred to the UL material 202 (e.g., the underlying hardmask) to form the patterned UL 801. According to some embodiments, a burn off can remove the first patterned resist (not shown) and the first SiARC (not shown).

According to some embodiments, the bottom UL etch and burn off of the first patterned resist and the first SiARC can be performed during the same dielectric etch in two or more steps, for example, using a Carbon tetrafluoride ($CF_4$) break thru (BT) etch to remove all native oxide on the top surface, then remove the first patterned resist 205 (mask) using, for example, an etch process with Chlorine ($Cl_2$) and/or HBr etch chemistries, and finish the transfer of the patterning using the bottom OPL 701 into the UL material 202 to form openings in a patterned UL 801.

Figure 9:
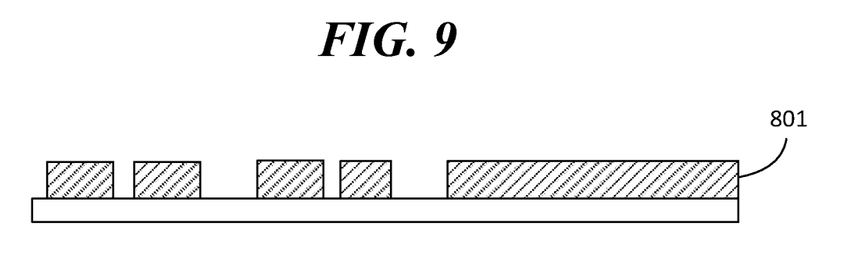

According to at least one embodiment and referring to FIG. 9, an OPL strip removes the remaining first OPL (not shown), leaving the patterned UL 801, patterned by a multi color mask, where the patterned UL 801 can be used in further process steps.

Figure 10:
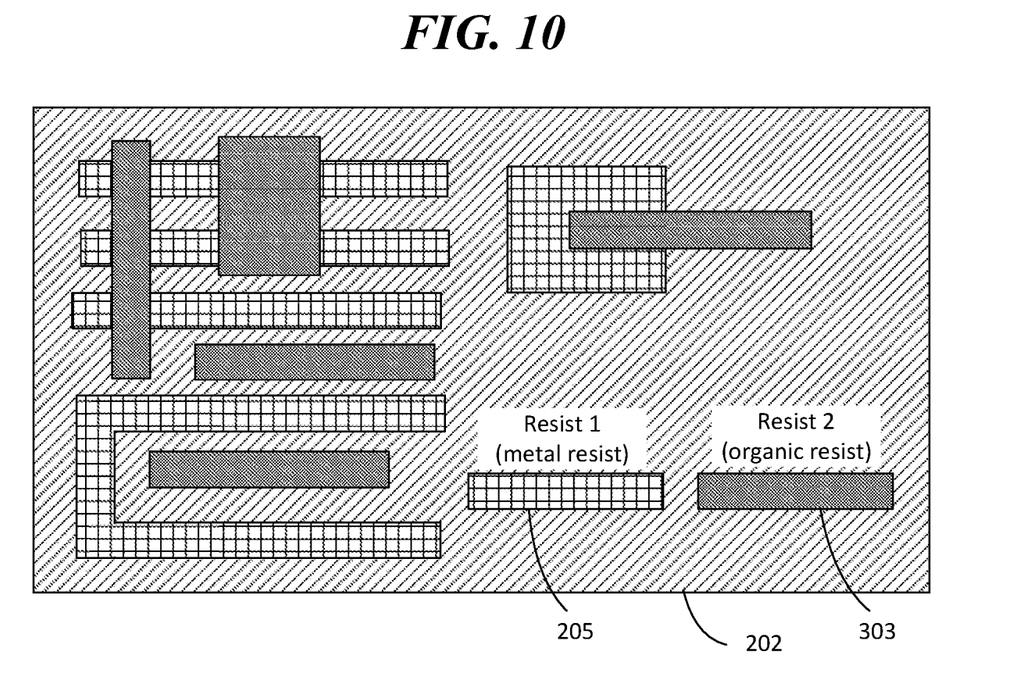
FIG. 10 is planar view of a multi color resist pattern formed by different resists according to an embodiments of the present invention.

FIG. 10 is planar via of a multi color resist pattern formed by a metal resist 205 and an organic resist 303 according to an embodiments of the present invention. According to some embodiments of the present invention, features defined by the multiple resists can be simultaneously transferred to the UL material 202 (e.g., underlying hardmask). It should be understood that intervening layers (e.g., the first OPL 203, the second OPL 301, etc.) are not shown in FIG. 10.

Figure 11:
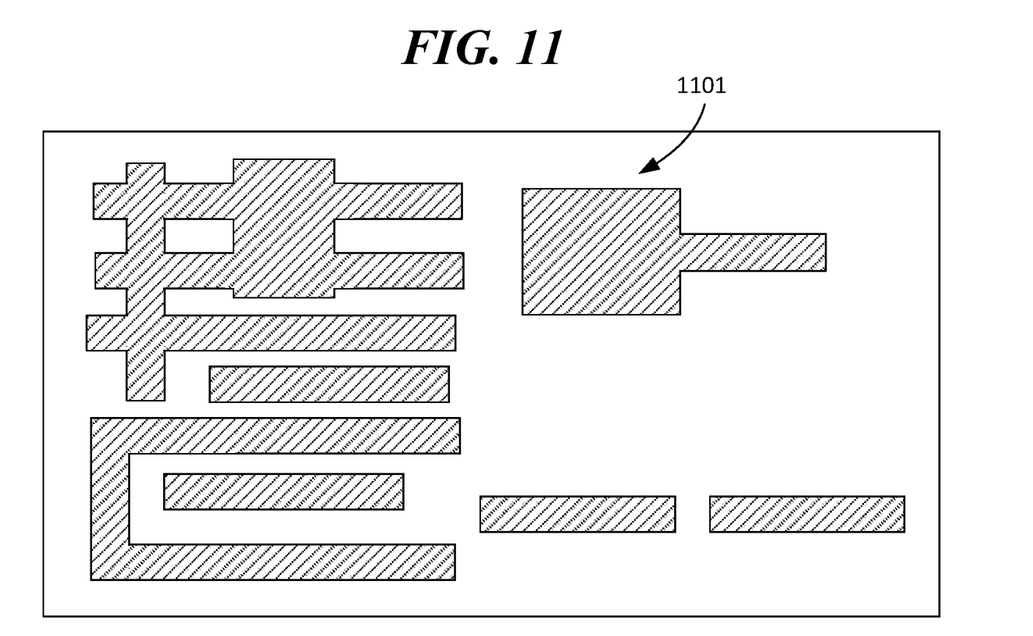
FIG. 11 is a planar view of a patterned structure formed using the multi color resist pattern of FIG. 10.

FIG. 11 is a planar view of a patterned structure 1101 formed in the UL using the multi color resist pattern of FIG. 10.

According to example embodiments of the present invention and as shown in FIGS. 4-8, a pattern of the second patterned resist is memorized in the second anti-reflective coating, a pattern of the second anti-reflective coating memorizing the second patterned resist is transferred to the first anti-reflective coating, and a pattern of the first patterned resist is memorized in the first anti-reflective coating. According to some embodiments, the patterned underlayer is patterned by a multi color mask.

FIG. 12 is a method 1200 of patterning using a multi color structure according to one or more embodiments of the present invention.

According to some embodiments and referring to FIG. 12, a second patterned SiARC is formed at step 1201 using a top SiARC etch. According to at least one embodiment, a patterned second OPL can be formed at step 1202, using the second patterned resist and the second Siarc as a mask, exposing a first patterned resist, which was previously memorized. According to some example embodiments, at step 1203, the second patterned resist, the second patterned SiARC, and a portion of the first SiARC can be removed by a top resist burn off and SiARC removal (e.g., etach). The removal of the portion of the first SiARC forms a first patterned SiARC, exposing a portion of a first OPL. According to at least one embodiment, a bottom OPL etch and top burn off can remove a portion of the first OPL and form a patterned first OPL at step 1204, exposing a portion of an UL, and removing the second OPL. According to at least one embodiment, a bottom UL etch can be performed, forming a patterned UL at step 1205. According to some embodiments of the present invention, features defined by the first patterned resist and the second patterned resist can be simultaneously transferred to the UL to form the patterned UL. According to some embodiments, a burn off removes the first patterned resist and the first patterned SiARC at step 1206.

According to some embodiments, the bottom UL etch at step 1205 and burn off of the first patterned resist and the first patterned SiARC at step 1206 can be performed in multiple steps.

According to at least one embodiment, an OPL strip removes the remaining first OPL at step 1207, leaving the patterned UL, patterned by a multi color mask, where the patterned UL can be used in further process steps.

According to some embodiments of the present invention, the first and second exposure can be memorized into the UL material 202 composed of, for example, Silicon, TiN, Oxide, etc., with a post hardmask open pattern transfer.

According to some embodiments, a fabrication system include a control for etch selectivity. According to at least one aspect, the control for this patterning technique having two different types of resists manages one or more etch processes with different etch chemistries, which have selectivity based on those different dry etch chemistries.

Recapitulation:

According to embodiments of the present invention, a method of forming a multi color resist structure includes providing a substrate including an underlayer material at step 101; forming a first organic planarizing layer on the substrate at step 102; forming a first anti-reflective coating on the first organic planarization layer at step 103; forming a first patterned resist on the first anti-reflective coating at step 104; forming a second organic planarizing layer on the first anti-reflective coating and on the first patterned resist at step 105; forming a second anti-reflective coating on the second organic planarization layer at step 106; and forming the second patterned resist at step 107, wherein the first patterned resist is one of an non-chemically amplified resist (n-CAR) and a metal base resist, and the second patterned resist is a CAR organic resist.

According to some embodiments, the method further includes patterning the underlayer material using the first patterned resist and the second patterned resist at step 108. According to some embodiments, the patterning of the underlayer material at step 108 is performing using the first patterned resist and the second patterned resist simultaneously.

According to some embodiments, the method further includes forming a first adhesion layer on the first anti-reflective coating at step 103 before forming the first patterned resist. According to some embodiments, the method further includes forming a second adhesion layer on the second anti-reflective coating at step 106 before forming the second patterned resist.

According to embodiments of the present invention, a method of forming a multi color resist structure includes providing a substrate including an underlayer material at step 101; forming a first patterning stack on the underlayer material at steps 102-104, wherein the first patterning stack is one of a first tri-layer patterning stack and a first quad-layer patterning stack, wherein forming the first patterning stack comprises forming a first patterned resist on the first patterning stack, wherein the first patterned resist is one of an non-chemically amplified resist (n-CAR) and a metal base resist; and forming a second patterning stack on the underlayer material at steps 105-107, wherein the second patterning stack is one of a second tri-layer patterning stack and a second quad-layer patterning stack, wherein forming the second patterning stack comprises forming a second patterned resist, and the second patterned resist is a CAR organic resist.

According to embodiments of the present invention, a multi color resist structure includes an underlayer material 202; a first organic planarizing layer 203 on the underlayer material; a first anti-reflective coating 204 on the first organic planarization layer; a first patterned resist 205 on the first anti-reflective coating, wherein the first patterned resist is one of an non-chemically amplified resist (n-CAR) and a metal base resist; a second organic planarizing layer 301 disposed over the first patterned resist and on a portion the first anti-reflective coating exposed by the first patterned resist; a second anti-reflective coating 302 on the second organic planarization layer; and a second patterned resist 303 on the second anti-reflective coating, wherein the second patterned resist is a CAR organic resist.

The terminology used herein is for the purpose of describing particular embodiments only and is not intended to be limiting of the invention. As used herein, the singular forms "a," "an" and "the" are intended to include the plural forms as well, unless the context clearly indicates other-wise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a multi color resist structure comprising:
   providing a substrate including an underlayer material;
   forming a first organic planarizing layer on the substrate;
   forming a first anti-reflective coating on the first organic planarization layer;
   forming a first patterned resist on the first anti-reflective coating;
   forming a second organic planarizing layer on the first anti-reflective coating and on the first patterned resist;
   forming a second anti-reflective coating on the second organic planarization layer; and
   forming a second patterned resist, wherein the first patterned resist is one of an non-chemically amplified resist (n-CAR) and a metal base resist, and the second patterned resist is a CAR organic resist.

2. The method of claim 1, further comprising patterning the underlayer material using the first patterned resist and the second patterned resist.

3. The method of claim 2, wherein the patterning of the underlayer material is performing using the first patterned resist and the second patterned resist simultaneously.

4. The method of claim 1, further comprising forming a first adhesion layer on the first anti-reflective coating before forming the first patterned resist.

5. The method of claim 1, further comprising forming a second adhesion layer on the second anti-reflective coating before forming the second patterned resist.

6. The method of claim 1, further comprising:
   memorizing the second patterned resist in the second anti-reflective coating;
   transferring a pattern of the second anti-reflective coating memorizing the second patterned resist to the first anti-reflective coating; and
   memorizing the first patterned resist in the first anti-reflective coating.

7. A method of forming a multi color resist structure comprising:
   providing a substrate including an underlayer material;
   forming a first patterning stack on the underlayer material, wherein the first patterning stack is one of a first tri-layer patterning stack and a first quad-layer patterning stack, wherein forming the first patterning stack comprises forming a first patterned resist on the first patterning stack, wherein the first patterned resist is one of an non-chemically amplified resist (n-CAR) and a metal base resist; and
   forming a second patterning stack on the underlayer material, wherein the second patterning stack is one of a second tri-layer patterning stack and a second quad-layer patterning stack, wherein forming the second patterning stack comprises forming a second patterned resist, and the second patterned resist is a CAR organic resist.

8. The method of claim 7, further comprising patterning the underlayer material using the first patterned resist and the second patterned resist.

9. The method of claim 8, wherein the patterning of the underlayer material is performing using the first patterned resist and the second patterned resist simultaneously.

10. The method of claim 7, wherein the first patterning stack is a tri-layer patterning stack and forming the first patterning stack further comprises:
    forming a first organic planarizing layer on the substrate;

forming a first anti-reflective coating on the first organic planarization layer; and forming the first patterned resist on the first anti-reflective coating.

11. The method of claim 7, wherein the first patterning stack is a quad-layer patterning stack and forming the first patterning stack further comprises:

forming a first organic planarizing layer on the substrate;

forming a first anti-reflective coating on the first organic planarization layer;

forming a first adhesion layer on the first anti-reflective coating before forming the first patterned resist; and forming the first patterned resist on the first anti-reflective coating.

12. The method of claim 7, wherein the second patterning stack is a tri-layer patterning stack and forming the second patterning stack further comprises:

forming a second organic planarizing layer on the first patterned resist on the first patterning stack;

forming a second anti-reflective coating on the second organic planarization layer; and forming the second patterned resist on the second anti-reflective coating.

13. The method of claim 7, wherein the second patterning stack is a quad-layer patterning stack and forming the second patterning stack further comprises:

forming a second organic planarizing layer on the first patterned resist on the first patterning stack;

forming a second anti-reflective coating on the second organic planarization layer;

forming a second adhesion layer on the second anti-reflective coating before forming the second patterned resist; and forming the second patterned resist on the second anti-reflective coating.

14. A multi color resist structure comprising;

an underlayer material;

a first organic planarizing layer on the underlayer material;

a first anti-reflective coating on the first organic planarization layer;

a first patterned resist on the first anti-reflective coating, wherein the first patterned resist is one of an non-chemically amplified resist (n-CAR) and a metal base resist;

a second organic planarizing layer disposed over the first patterned resist and on a portion the first anti-reflective coating exposed by the first patterned resist;

a second anti-reflective coating on the second organic planarization layer; and a second patterned resist on the second anti-reflective coating, wherein the second patterned resist is a CAR organic resist.

15. The multi color resist structure of claim 14, further comprising a first adhesion layer disposed between the first anti-reflective coating and the first patterned resist.

16. The multi color resist structure of claim 14, further comprising a second adhesion layer disposed between the second anti-reflective coating and the second patterned resist.

17. The multi color resist structure of claim 14, wherein at least a portion of the second patterned resist overlaps, in a planar view, at least a portion of the first patterned resist.

* * * * *